(12) United States Patent
Wang

(10) Patent No.: US 7,232,318 B2
(45) Date of Patent: Jun. 19, 2007

(54) IC EMBEDDING SEAT

(75) Inventor: Sung-Lai Wang, Wu Gu Shiang (TW)

(73) Assignee: Lih Duo International Co., Ltd., Taipei County (TW)

( * ) Notice: Subject to any disclaimer, the term of this patent is extended or adjusted under 35 U.S.C. 154(b) by 0 days.

(21) Appl. No.: 11/283,807

(22) Filed: Nov. 22, 2005

(65) Prior Publication Data
US 2007/0117425 A1 May 24, 2007

(51) Int. Cl.
*H01R 13/44* (2006.01)
(52) U.S. Cl. .................................. 439/135; 439/331
(58) Field of Classification Search ............... 439/135, 439/331, 940
See application file for complete search history.

(56) References Cited

U.S. PATENT DOCUMENTS 3,831,131 A * 8/1974 Woodcock et al. ......... 439/331
4,012,117 A * 3/1977 Lazzery ....................... 349/60
4,236,777 A * 12/1980 Merlina et al. .............. 439/71

* cited by examiner

*Primary Examiner*—Khiem Nguyen
(74) *Attorney, Agent, or Firm*—Bacon & Thomas, PLLC

(57) ABSTRACT

An IC embedding seat comprises a body and a sliding cover to form a sliding mechanism provided for IC with BGA package no longer using SMT, soldering paste, or flux for IC maintenance and replacement, the body has one or more IC containers each of which bottom has a conducting pin array formed by a plurality of conducting pin units with elasticity and conductivity arrayed in matrix arrangement, and the sliding cover is constructed a cover to the body with sliding movement to open or close the body, so that the IC is easily embedded into the IC container of the body to get a well electrical connection with the corresponding conducting pin units of the body after simply sliding the sliding cover to close the body, and without de-soldering process the embedded IC is freely removed from the IC container by sliding the sliding cover to open the body.

2 Claims, 6 Drawing Sheets

IC EMBEDDING SEAT

BACKGROUND OF THE INVENTION

1. Field of the Invention

The present invention relates to an integrated circuit (IC) embedding seat, more particularly, the IC embedding seat provides the advantage of easy installation and free removal of IC with BGA package without soldering or de-soldering.

2. Description of the Prior Art

At the present, the IC package method is tended to use the package of ball grid array (BGA) instead of the prior package of thin small outline (TSOP) now. The BGA package method of the IC uses the surface mount technology (SMT) to solder the pads on the bottom of the IC being connected to the circuit joints of the PCB as a body, and the IC is then fixed on the PCB.

However, the shortage of the IC soldered on the PCB by the pads is very difficult maintenance and replacement for the IC. While processing the IC maintenance and replacement, it requires de-soldering with high temperature. For maintaining or replacing the IC, it also requires re-implanting the pads to the IC and re-positioning the IC to the PCB. Therefore, there are some difficulties on implanting the pads and re-positioning IC.

In particular, in the maintenance process during removing the pads with high temperature, the IC always gets damaged under high temperature. Furthermore, the removed pads from the maintenance process and the soldering paste and the flux from the process of re-implanting the pads all will cause environmental pollution problem that is detrimental to the environment.

SUMMARY OF THE INVENTION

In order to overcome the shortages of the inconvenient maintenance and replacement for the present IC, the objective of the present invention is to provide an IC embedding seat which can provide an easy assembly and a free removal for a BGA packaged IC with pads or a non-BGA packaged IC having circuit joints or connections on the bottom.

The IC embedding seat may be assembled to PCB and formed an electrical connection with the PCB. In particular, for IC maintenance and replacement, the IC embedding seat of the present invention does not need to process de-soldering with high temperature, and does not require using SMT, soldering paste, or flux. Therefore, the IC embedding seat can completely avoid the troubles of re-implanting the pads and re-positioning the IC, which has further some advantages as the followings:

1. It is very convenient for IC's maintenance and replacement.
2. It can reduce the cost and the trouble of re-implanting the pads.
3. It does not require a specialized positioning as well as can maintain and replace IC anytime.
4. It can avoid IC getting damaged from high soldering temperature.
5. The soldering paste and the flux will not be used, and can achieve a better effect in environmental protection.

The further objective of the present invention is to provide an IC embedding seat comprising a body and a sliding cover to jointly form a sliding mechanism with relative sliding movement so that the body can be simply opened and closed by the sliding cover by sliding method, and the body has one or more IC containers each provided with the effect of positioning IC and provided for easily mounting IC into or freely removing IC from the IC container. Arranged on the bottom of each IC container of the body is a conducting pin array which is formed by a plurality of conducting pin unit with elasticity and conductivity and arranged in matrix arrangement. Therefore, when IC is embedded into the IC container of the body by an assembly method, a well electrical connection shall be achieved in between the IC and the corresponding conducting pin units.

The IC embedding seat of the present invention can be used widely, which is applicable for IC with the BGA package or IC with non-BGA package having the circuit joints on the bottom being easily embedded into the IC embedding seat. It does not require using soldering paste and flux, and it is very convenient for the user to assembly, maintain or replace the IC as well as to achieve a better effect in environmental protection.

DESCRIPTION OF THE PREFERRED EMBODIMENT

Figure 1:
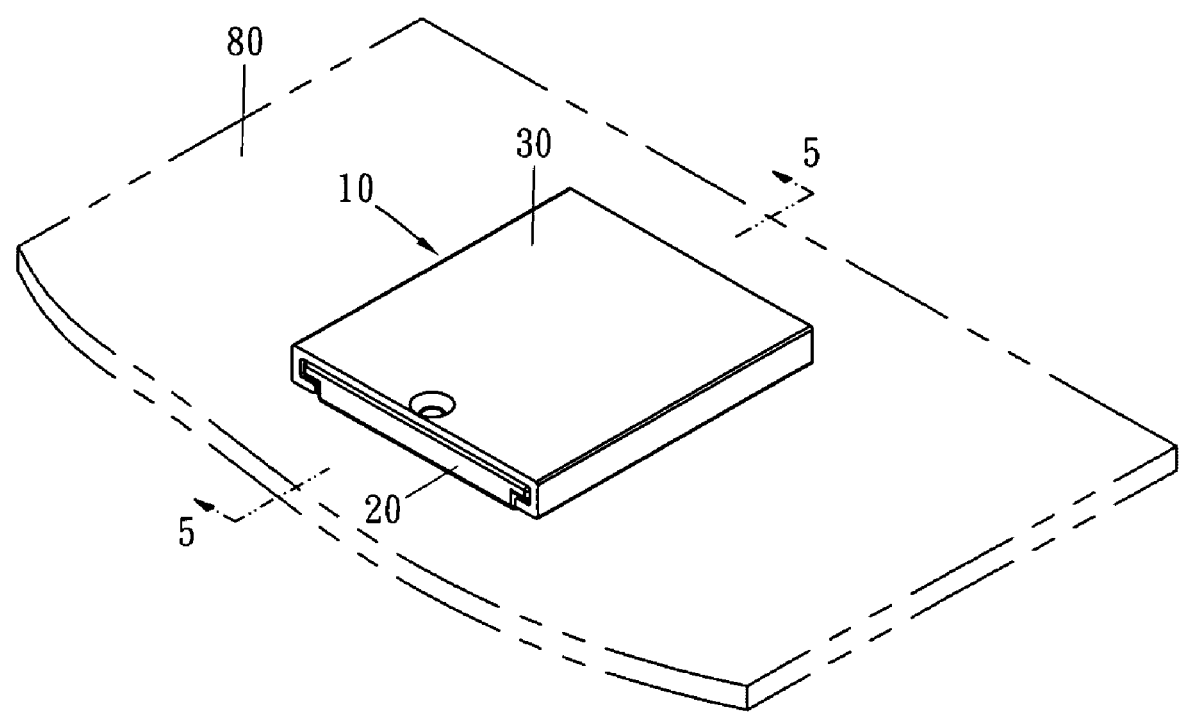
FIG. 1 is the schematic drawing of the IC embedding seat of the present invention in usage status.
Figure 2:
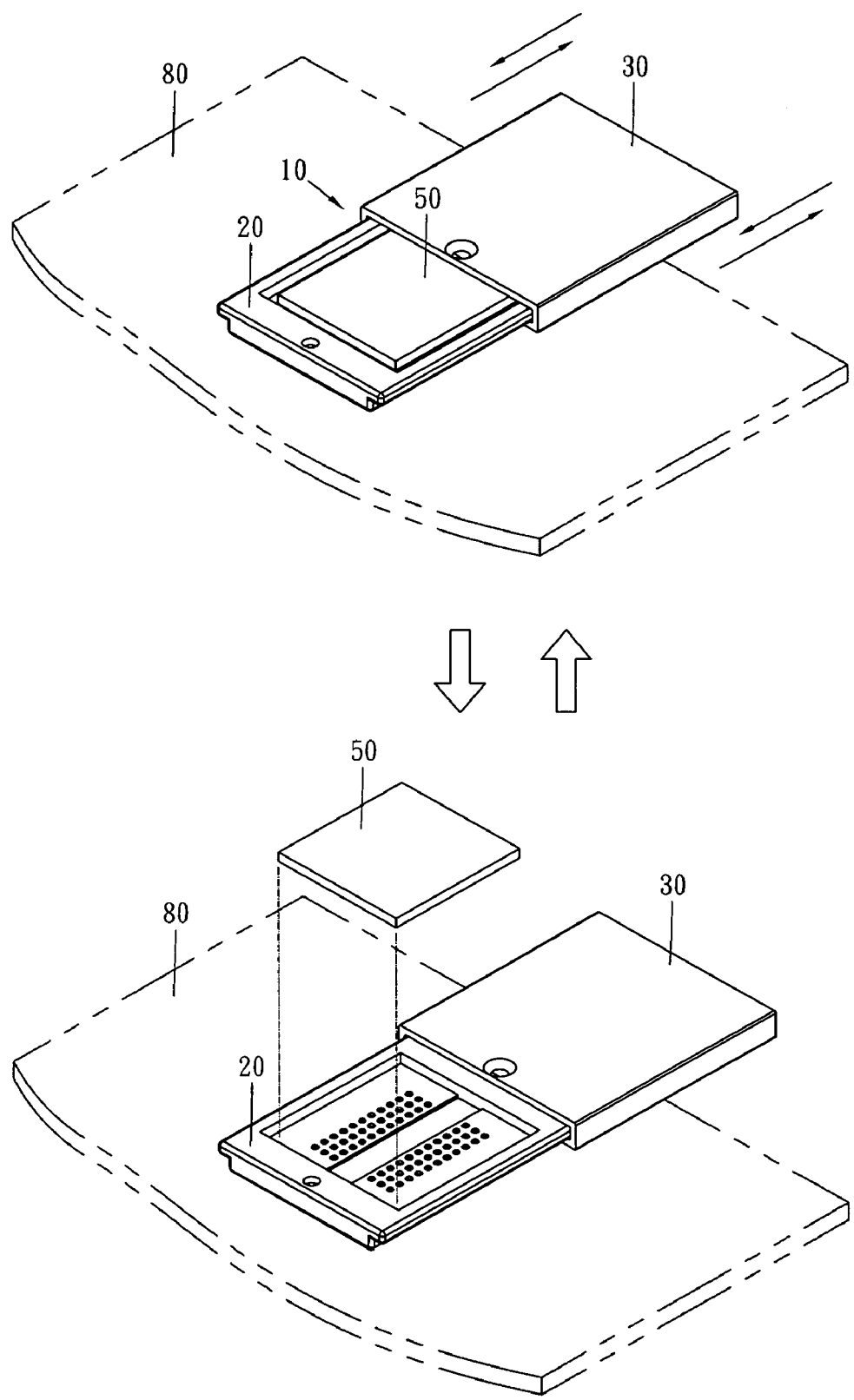
FIG. 2 is an illustrating drawing to show an IC embedding seat of the present invention providing easy assembly, maintenance, and replacement for the IC.

As illustrated in FIGS. 1 and 2, the present invention is to provide an IC embedding seat 10, which comprises a body 20 and a sliding cover 30 for jointly forming a sliding mechanism. The sliding cover 30 can open or close the body 20 by way of generating a sliding movement corresponding to the body 20. By sliding movement of the sliding cover 30, the body 20 therefore has a function similar to a cabinet. It can provide an assembly method for the IC 50 to be embedded into or dismounted from the body 20 freely.

Figure 3:
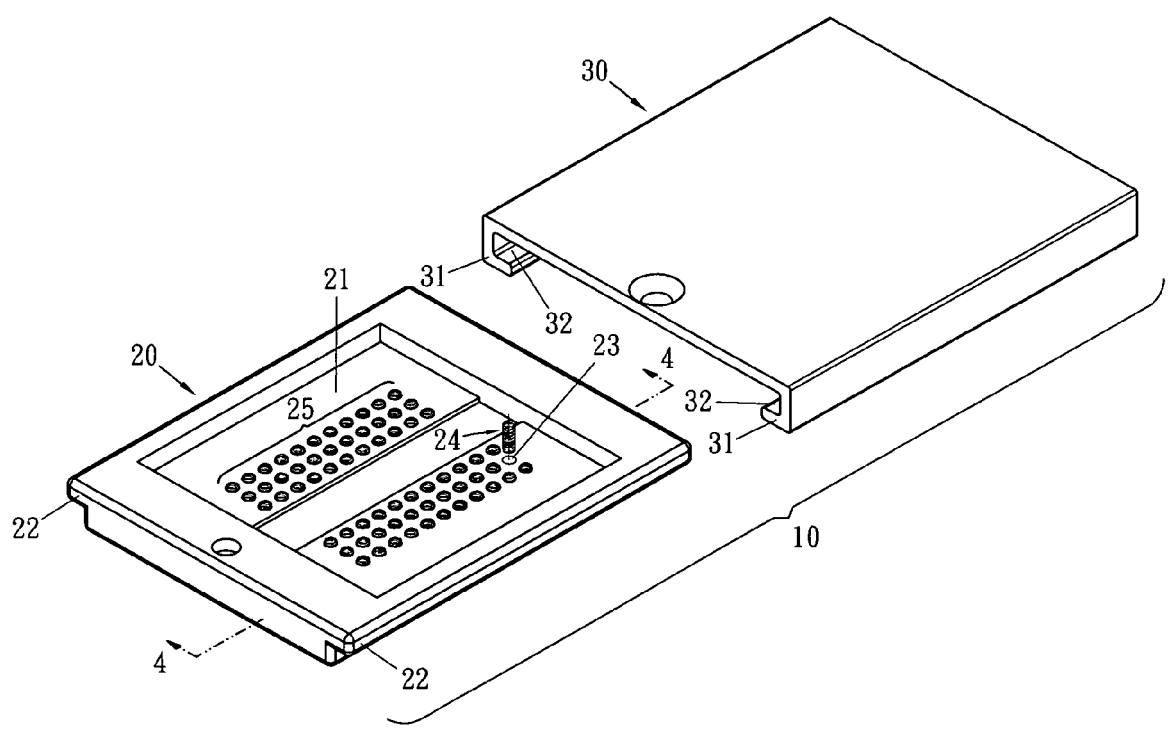
FIG. 3 is an enlarged drawing of the IC embedding seat of the present invention.
Figure 4:
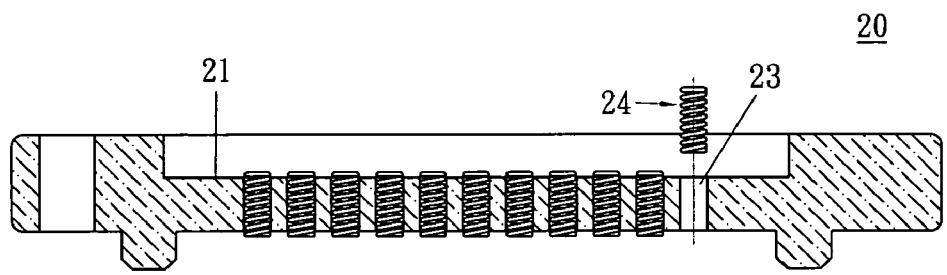
FIG. 4 is an enlarged sectional view along line 4—4 of FIG. 3.
Figure 8:
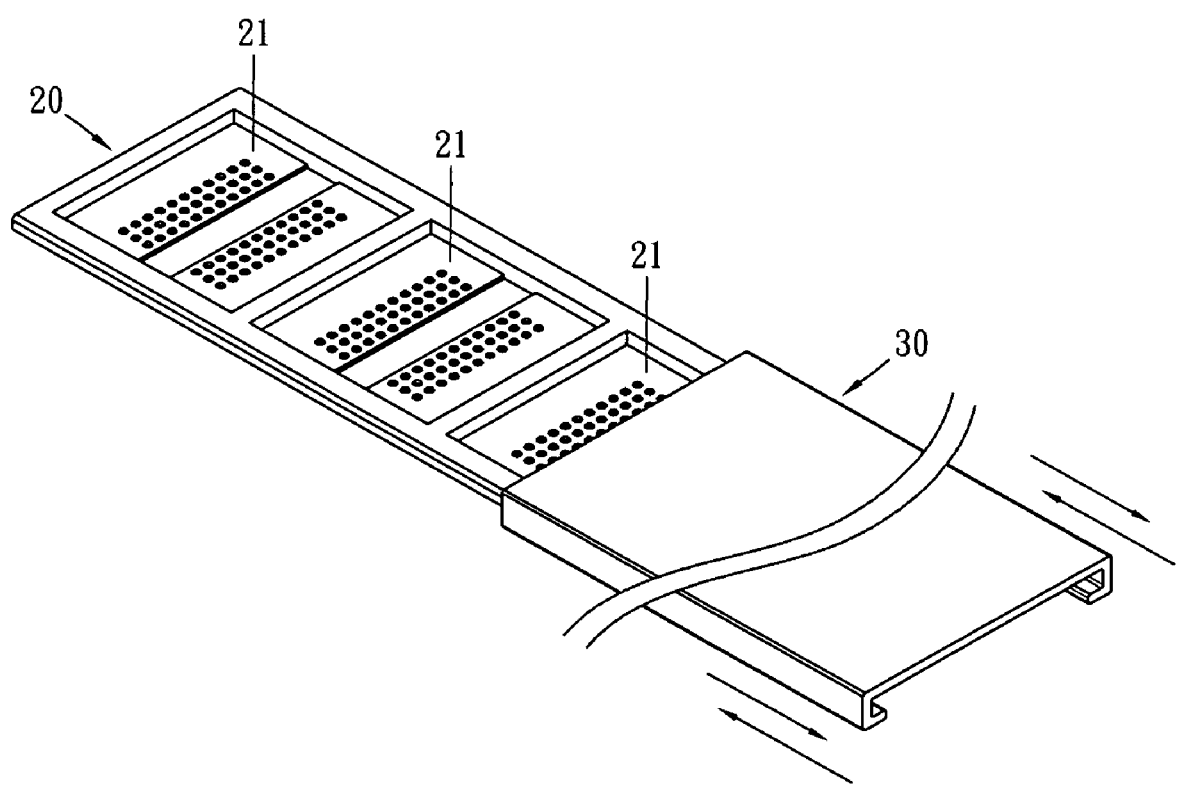
FIG. 8 is the schematic drawing to show the body of the IC embedding seat of the present invention having one or more IC container.

As shown in FIGS. 3, 4, and 8, the structure of the body 20 includes an outward sliding block 22 in both sides of the body 20 respectively. The body 20 has one or more IC container 21. More particularly, the bottom of each IC container 21 of the body 20 has a plurality of positioning holes 23 formed and arrayed in matrix arrangement. After the conducting pin units 24 with elasticity and conductivity are implanted into each positioning hole 23, the bottom of each IC container 21 has a conducting pin array 25. The conducting pin units 24 in the preferred embodiment include a metal spring, an elastic probe pin, and a metal dome. The metal spring is the best preferred embodiment.

The structure of the sliding cover 30 is shaped by having its two edges bent downwardly to form a bent portions 31 which also forms a sliding slot 32 on both sides opposite to each other and fitted to the corresponding sliding block 22 of the body 20 to construct a sliding mechanism. Thus, the sliding cover 30 forms the cover of the body 20 to provide means for opening or closing the body 20 by sliding movement.

Figure 5:
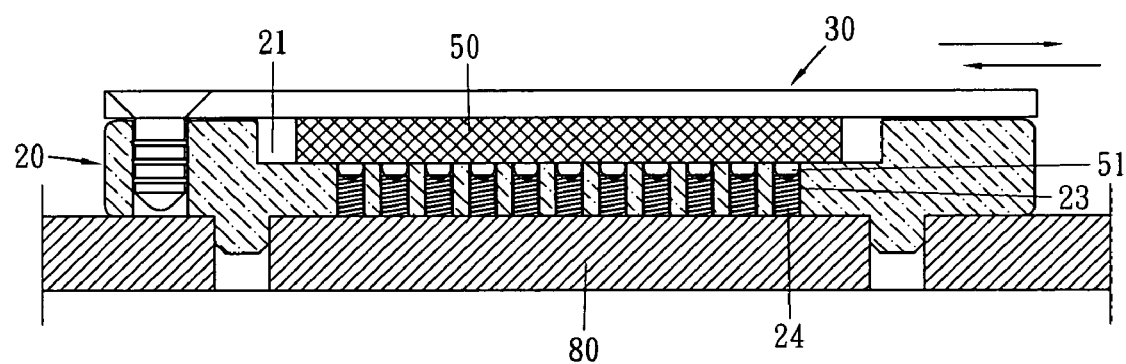
FIG. 5 is an enlarged sectional view along line 5—5 of FIG. 1.
Figure 7:
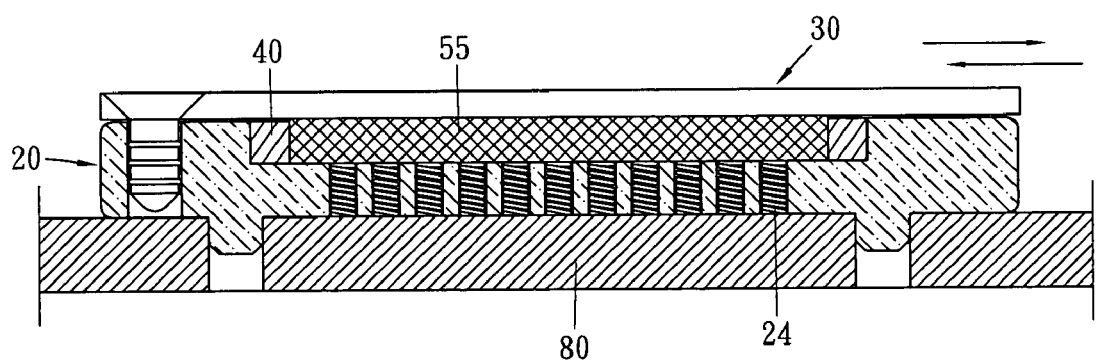
FIG. 7 is an enlarged sectional view showing an IC embedding seat of the present invention using an auxiliary positioning frame to achieve the positioning of the plane IC.

As shown in FIGS. 2, 5, and 7, each IC container 21 of the body 20 of the present invention is to provide an assembly method not only for the IC 50 with the pads 51 by the BGA package to embed into the inside freely, but also for the plane IC 55 with non-BGA package having circuit joints (not shown in the FIG. 7) on the bottom to embed into the inside freely. Besides, after the IC 50 or the plane IC 55 is embedded into the IC container 21 of the body 20, the pads 51 on the bottom of the IC 50 or the circuit joints on the bottom of the plane IC 55 do press the conducting pin array 25 of the IC container 21 of the body 20. Therefore, the corresponding conducting pin units 24 under the pressure generate the extended force, and touch the pads 51 on the bottom of the IC 50 or the circuit joints on the bottom of the plane IC 55.

And, after the sliding cover 30 closing the body 20 and forming as the cover of the body 20, the activities of the IC 50 or the plane IC 55 are limited by the sliding cover 30. Further, the pads 51 on the bottom of the IC 50 (or the circuit joints on the bottom of the plane IC 55) and the corresponding conducting pin units 24 of the IC container 21 of the body 20 can form a close contact as well as a well electrical connection.

Moreover, the IC embedding seat 10 of the present invention uses the sliding cover 30 to open the body 20 by sliding movement, and the IC 50 or the plane IC 55 can be easily embedded into the IC container 21 of the body 20 freely. It does not require using SMT, soldering paste, and the flux. Instead, it only needs to push the sliding cover 30 for closing the body 20, and the assembly of the IC 50 or the plane IC 55 is completed. In other words, after the body 20 is opened by sliding movement from the sliding cover 30, the IC 50 or the plane IC 55 is freely removed from the inside of the body 20 of the IC embedding seat 10 of the present invention.

In the usage, the body 20 of the IC embedding seat 10 of the present invention is fixed on a PCB 80. And, the conducting pin units 24 of the IC container 21 of the body 20 and the circuits of the PCB 80 form an electrical connection. Therefore, the IC embedding seat 10 of the present invention by sliding the sliding cover 30 can present an opening status for the body 20 so that the IC 50 or the plane IC 55 is freely and easily embedded into the IC container 21 of the body 20. Further, the pads 51 on the bottom of the embedded IC 50 (or the circuit joints on the bottom of the embedded plane IC 55) and the corresponding conducting pin units 24 of the IC container 21 of the body 20 can form an electrical connection. The body 20 by sliding the sliding cover can present a closing status so that the embedded IC 50 or the embedded plane IC 55 can form a well electrical connection with the circuits of the PCB 80.

Accordingly, the IC embedding seat 10 of the present invention can use an assembly method for the IC 50 or the plane IC 55 to form an electrical connection with the circuits of the PCB 80. More particularly, the IC 50 or the plane IC 55 can be replaced anytime so that it has an easy assembly, convenient maintenance or replacement for the IC 50 and the plane IC 55.

The IC embedding seat 10 of the present invention also has a function to position the IC 50 or the plane IC 55. As shown in FIGS. 5 and 7, the IC embedding seat 10 of the present invention is structured in such a way that the positioning holes 23 formed in each IC container 21 of the body 20 are arranged into matrix form to fit the position of the corresponding pads 51 on the bottom of the IC 50, or to match the position of the corresponding circuit joints on the bottom of the plane IC 55.

Therefore, as shown in FIG. 5, when the IC 50 having the pads 51 on the bottom is embedded into the IC container 21 of the body 20 of the IC embedding seat 10, the positioning holes 23 of the IC container 21 of the body 20 may provide the pads 51 of the IC 50 being embedded into the interior of the positioning holes 23 as well as perform a IC 50 positioning effect.

Figure 6:
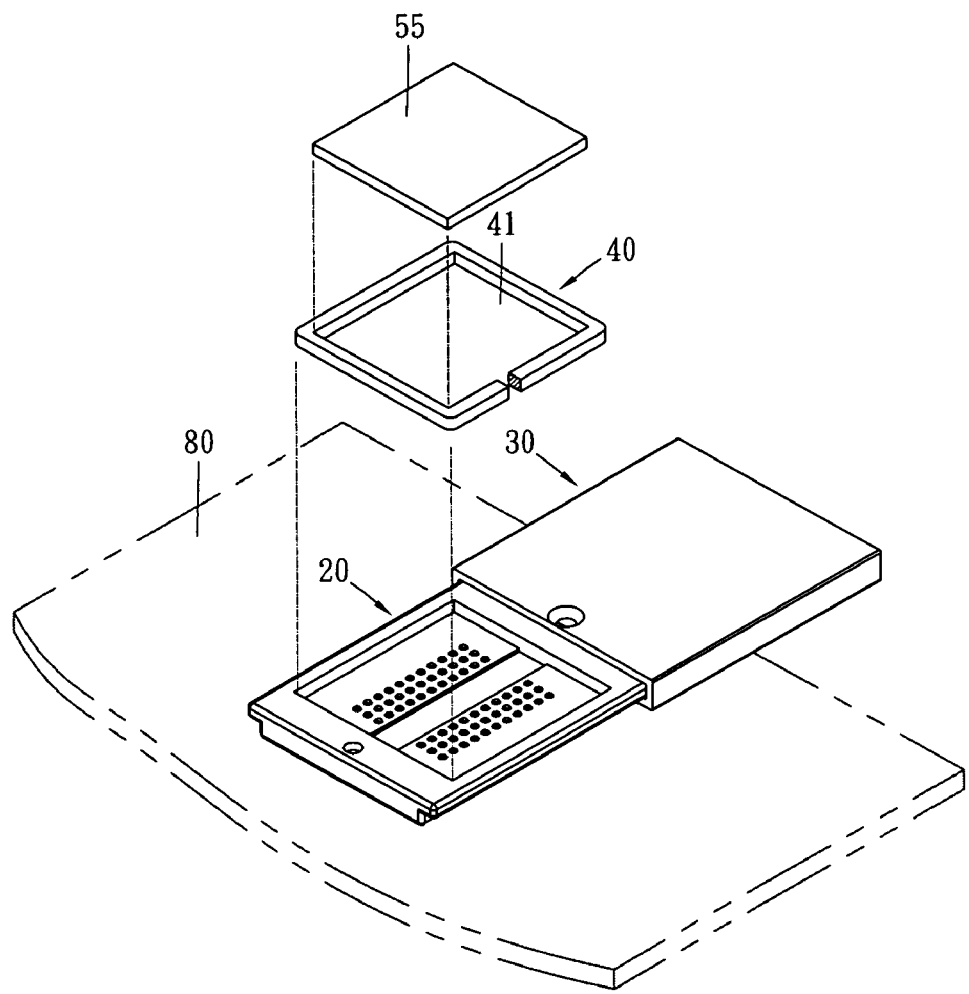
FIG. 6 is an assembly drawing illustrating an IC embedding seat of the present invention which uses an auxiliary positioning frame to achieve the component positioning of the plane IC.

As shown in FIGS. 6 and 7, when the plane IC 55 with the circuit joints on the bottom is embedded into the IC container 21 of the IC embedding seat 10 of the present invention, an auxiliary positioning frame 40 is used to achieve a positioning effect. The auxiliary positioning frame 40 has an inner hollow space 41, and the plane IC 55 can be closely embedded in the inside. Further, the outer rim of the auxiliary positioning frame 40 corresponding to the appearance of the IC container 21 of the body 20 of the present invention shall be able to tightly fit into the IC container 21 of the body 20.

Therefore, the plane IC 55 first is closely embedded into the inside of the inner hollow space 41 of the auxiliary positioning frame 40, and then is closely embedded into the inside of the IC container 21 together with the auxiliary positioning frame 40. Therefore, the IC container 21 of the body 20 of the present invention can perform the function of positioning the plane IC 55 so that the circuit joints on the bottom of the embedded plane IC 55 can form a well electrical connection with the corresponding conducting pin units 24 of the IC container of the body 20.

According to the above description, the IC embedding seat 10 of the present invention has the function of positioning IC 50 or plane IC 55. For the assembly of the IC 50 or the plane IC 55, it can totally reduce the troubles of soldering and positioning. The user can easily replace the IC by DIY without any obstruction. More particularly, it does not require using the soldering paste or the flux while assembling, maintaining, or replacing the IC 50 or the plane IC 55 for a better effect in environmental protection. When the IC 50 or the plane IC 55 is freely removed from the inside of the body 20 of the IC embedding seat 10 of the present invention, it does not require using de-soldering with high temperature so that the IC 50 and the plane IC 55 can avoid getting damaged from high temperature.

In another preferred embodiment of the IC embedding seat 10 of the present invention, both sides of the body 20 are changed as the ones with the sliding slots, and the both sides of the sliding cover 30 are changed as the ones with the corresponding sliding blocks for jointly forming a sliding mechanism with a relative sliding movement.

What is claimed is:

1. An integrated circuit (IC) embedding seat into which an IC may be easily embedded without soldering and from which the IC may be easily removed, the embedding seat respectively accommodating both a ball grid array (BGA) packaged IC with pads and a non-BGA packaged plane IC having circuit connections on its bottom, comprising a body and a sliding cover for jointly forming a sliding mechanism with relative sliding movement between the cover and body;

wherein the body has one or more IC containers adapted to embed either the BGA packaged IC or the non-BGA packaged plane IC therein, wherein each IC container has a plurality of positioning holes arrayed in a matrix arrangement on the bottom of the container and each positioning hole of the IC container has a metal spring freely implanted inside, wherein when a BGA packaged IC is embedded in said IC container, said pads extend into said positioning holes and when a non-BGA packaged plane IC is embedded in said IC container, said circuit connections do not extend into said positioning holes, the respective springs engaging said pads of the BGA packaged IC when the pads are positioned in said holes, and the respective springs engaging said circuit connections when said non-BGA packaged plane IC is embedded in said IC container; and wherein the sliding cover is constructed a cover of the body with sliding movement to open or close the body, opposite sides of the body having an outward sliding block and opposite sides of the sliding cover have a corresponding sliding slot respectively.

2. The IC embedding seat as recited in claim 1, wherein the IC embedding seat further includes an auxiliary positioning frame having an inner hollow space for an IC to be closed embedded therein and an outer rim able to tightly fit into the IC container of the body.

* * * * *